United States Patent
Kirsch et al.

(10) Patent No.: US 9,899,070 B2
(45) Date of Patent: Feb. 20, 2018

(54) MODIFIED DECODE FOR CORNER TURN

(71) Applicant: Micron Technology, Inc., Boise, ID (US)

(72) Inventors: Graham Kirsch, Tadley (GB); Martin Steadman, Sandhurst (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/048,133

(22) Filed: Feb. 19, 2016

(65) Prior Publication Data
US 2017/0243623 A1 Aug. 24, 2017

(51) Int. Cl.
| G11C 7/10 | (2006.01) |
| G11C 8/10 | (2006.01) |
| G11C 8/06 | (2006.01) |

(52) U.S. Cl.
CPC . *G11C 8/10* (2013.01); *G11C 8/06* (2013.01)

(58) Field of Classification Search
CPC .................................. G11C 8/10; G11C 8/06
USPC ..................................... 365/189.05
See application file for complete search history.

(56) References Cited

U.S. PATENT DOCUMENTS

| 4,380,046 | A | 4/1983 | Fung |
| 4,435,792 | A | 3/1984 | Bechtolsheim |
| 4,435,793 | A | 3/1984 | Ochii |
| 4,727,474 | A | 2/1988 | Batcher |
| 4,843,264 | A | 6/1989 | Galbraith |
| 4,852,065 | A | 7/1989 | Baddiley |
| 4,958,378 | A | 9/1990 | Bell |
| 4,977,542 | A | 12/1990 | Matsuda et al. |
| 5,023,838 | A | 6/1991 | Herbert |
| 5,034,636 | A | 7/1991 | Reis et al. |
| 5,079,739 | A | 1/1992 | Petersen |
| 5,201,039 | A | 4/1993 | Sakamura |
| 5,210,850 | A | 5/1993 | Kelly et al. |
| 5,253,308 | A | 10/1993 | Johnson |
| 5,276,643 | A | 1/1994 | Hoffmann et al. |
| 5,325,519 | A | 6/1994 | Long et al. |

(Continued)

FOREIGN PATENT DOCUMENTS

| CN | 102141905 | 8/2011 |
| EP | 0214718 | 3/1987 |

(Continued)

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

(Continued)

*Primary Examiner* — Anthan Tran
(74) *Attorney, Agent, or Firm* — Brooks, Cameron & Huebsch, PLLC

(57) ABSTRACT

Examples of the present disclosure provide apparatuses and methods for performing a corner turn using a modified decode. An example apparatus can comprise an array of memory cell and decode circuitry coupled to the array and including logic configured to modify an address corresponding to at least one data element in association with performing a corner turn operation on the at least one data element. The logic can be configured to modify the address corresponding to the at least one data element on a per column select basis.

22 Claims, 9 Drawing Sheets

(56) References Cited

U.S. PATENT DOCUMENTS

| | | |
|---|---|---|
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,406,525 A | 4/1995 | Nicholes |
| 5,440,482 A | 8/1995 | Davis |
| 5,446,690 A | 8/1995 | Tanaka et al. |
| 5,449,907 A | 9/1995 | McKeeman et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,606,707 A | 2/1997 | Tomassi et al. |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,740,340 A | 4/1998 | Purcell et al. |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,954,831 A | 9/1999 | Chang |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,411,333 B1 | 6/2002 | Auld et al. |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,546,516 B2 | 6/2009 | Helbig |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,907,473 B2 | 3/2011 | Ishizaki et al. |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mokhlesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,437,217 B2 | 5/2013 | Pekny |
| 8,447,962 B2 | 5/2013 | Hughes et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung |
| 8,644,101 B2 | 2/2014 | Jun et al. |
| 8,650,232 B2 | 2/2014 | Stortz et al. |
| 8,688,962 B2 | 4/2014 | Raikin et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |

(56) References Cited

U.S. PATENT DOCUMENTS

| | | | |
|---|---|---|---|
| 9,165,023 B2 | 10/2015 | Moskovich et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0015633 A1* | 1/2004 | Smith | G06F 15/17343 710/305 |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0036801 A1 | 2/2006 | Jones et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0241405 A1 | 10/2007 | Popoff | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0162824 A1* | 7/2008 | Jalowiecki | G06F 7/785 711/149 |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2009/0300091 A1* | 12/2009 | Brokenshire | G06F 17/16 708/607 |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Lerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0040596 A1 | 2/2014 | Fleischer et al. | |
| 2014/0153399 A1* | 6/2014 | Song | G06F 15/17381 370/238 |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029798 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0085589 A1 | 3/2015 | Lu et al. | |
| 2015/0279466 A1 | 3/2015 | Manning | |
| 2015/0120987 A1 | 4/2015 | Wheeler | |
| 2015/0134713 A1 | 5/2015 | Wheeler | |
| 2015/0270015 A1 | 9/2015 | Murphy et al. | |
| 2015/0324290 A1 | 11/2015 | Leidel | |
| 2015/0325272 A1 | 11/2015 | Murphy | |
| 2015/0356009 A1 | 12/2015 | Wheeler et al. | |
| 2015/0356022 A1 | 12/2015 | Leidel et al. | |
| 2015/0357007 A1 | 12/2015 | Manning et al. | |
| 2015/0357008 A1 | 12/2015 | Manning et al. | |
| 2015/0357019 A1 | 12/2015 | Wheeler et al. | |
| 2015/0357020 A1 | 12/2015 | Manning | |
| 2015/0357021 A1 | 12/2015 | Hush | |
| 2015/0357022 A1 | 12/2015 | Hush | |
| 2015/0357023 A1 | 12/2015 | Hush | |
| 2015/0357024 A1 | 12/2015 | Hush et al. | |
| 2015/0357047 A1 | 12/2015 | Tiwari | |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

(56) References Cited

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

Search Report and Written Opinion for related PCT Application No. PCT/US2017/017760, dated May 31, 2017, 12 pages.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

\* cited by examiner

|  | 333-0 | 333-1 | 333-2 | 333-3 |
|---|---|---|---|---|
| 335-0 | 0:0 | 0:1 | 0:2 | 0:3 |
| 335-1 | 1:0 | 1:1 | 1:2 | 1:3 |
| 335-2 | 2:0 | 2:1 | 2:2 | 2:3 |
| 335-3 | 3:0 | 3:1 | 3:2 | 3:3 |

*Fig. 3A*

|  | 333-4 | 333-5 | 333-6 | 333-7 |  |
|---|---|---|---|---|---|
| 335-4 | 0:0 | 1:0 | 2:0 | 3:0 | 00 — 337-0 |
| 335-5 | 1:1 | 0:1 | 3:1 | 2:1 | 01 — 337-1 |
| 335-6 | 2:2 | 3:2 | 0:2 | 1:2 | 10 — 337-2 |
| 335-7 | 3:3 | 2:3 | 1:3 | 0:3 | 11 — 337-3 |

|  | 333-8 | 333-9 | 333-10 | 333-11 |
|---|---|---|---|---|
| 335-8 | 0:0 | 1:0 | 2:0 | 3:0 |
| 335-9 | 0:1 | 1:1 | 2:1 | 3:1 |
| 335-10 | 0:2 | 1:2 | 2:2 | 3:2 |
| 335-11 | 0:3 | 1:3 | 2:3 | 3:3 |

*Fig. 3C*

| | 769-0 | 769-1 | 769-2 | 769-3 | 769-4 | 769-5 | 769-6 | 769-7 |
|---|---|---|---|---|---|---|---|---|
| 774-0 ROW 0 | 0:0 | 1:0 | 2:0 | 3:0 | 4:0 | 5:0 | 6:0 | 7:0 |
| 774-1 ROW 1 | 0:1 | 1:1 | 2:1 | 3:1 | 4:1 | 5:1 | 6:1 | 7:1 |
| 774-2 ROW 2 | 0:2 | 1:2 | 2:2 | 3:2 | 4:2 | 5:2 | 6:2 | 7:2 |
| 774-3 ROW 3 | 0:3 | 1:3 | 2:3 | 3:3 | 4:3 | 5:3 | 6:3 | 7:3 |
| 774-4 ROW 4 | 0:4 | 1:4 | 2:4 | 3:4 | 4:4 | 5:4 | 6:4 | 7:4 |
| 774-5 ROW 5 | 0:5 | 1:5 | 2:5 | 3:5 | 4:5 | 5:5 | 6:5 | 7:5 |
| 774-6 ROW 6 | 0:6 | 1:6 | 2:6 | 3:6 | 4:6 | 5:6 | 6:6 | 7:6 |
| 774-7 ROW 7 | 0:7 | 1:7 | 2:7 | 3:7 | 4:7 | 5:7 | 6:7 | 7:7 |

MODIFIED DECODE FOR CORNER TURN

TECHNICAL FIELD

The present disclosure relates generally to semiconductor memory apparatuses and methods, and more particularly, to apparatuses and methods related to modified decode for corner turn operations.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the operations and/or data may also be sequenced and/or buffered.

In many instances, the processing resources (e.g., processor and/or associated functional unit circuitry) may be external to the memory array, and data can be accessed (e.g., via a bus between the processing resources and the memory array) to execute instructions. Data can be moved from the memory array to registers external to the memory array via a bus.

Data can be stored in memory cells of a memory array in a number of arrangements. For example, when stored horizontally, portions of data can be stored in memory cells coupled to a plurality of sense lines and an access line. Meanwhile, when stored vertically, portions of data can be stored in memory cells coupled to a sense line and a plurality of access lines.

BRIEF DESCRIPTION OF THE DRAWINGS

FIG. 2A illustrates data stored in an array in accordance with a particular storage format.

FIG. 2B illustrates data stored in an array in accordance with a particular storage format.

FIG. 3A illustrates a number of data elements stored in an array in accordance with a number of embodiments of the present disclosure.

FIG. 3B illustrates a number of data elements stored in an array subsequent to performance of at least a portion of a corner turn operation in accordance with a number of embodiments of the present disclosure.

FIG. 3C illustrates a number of data elements stored in an array in accordance with a number of embodiments of the present disclosure.

FIG. 7 illustrates a number of data elements stored in an array in association with performing a corner turn operation in accordance with a number of embodiments of the present disclosure.

DETAILED DESCRIPTION

Figure 1A:
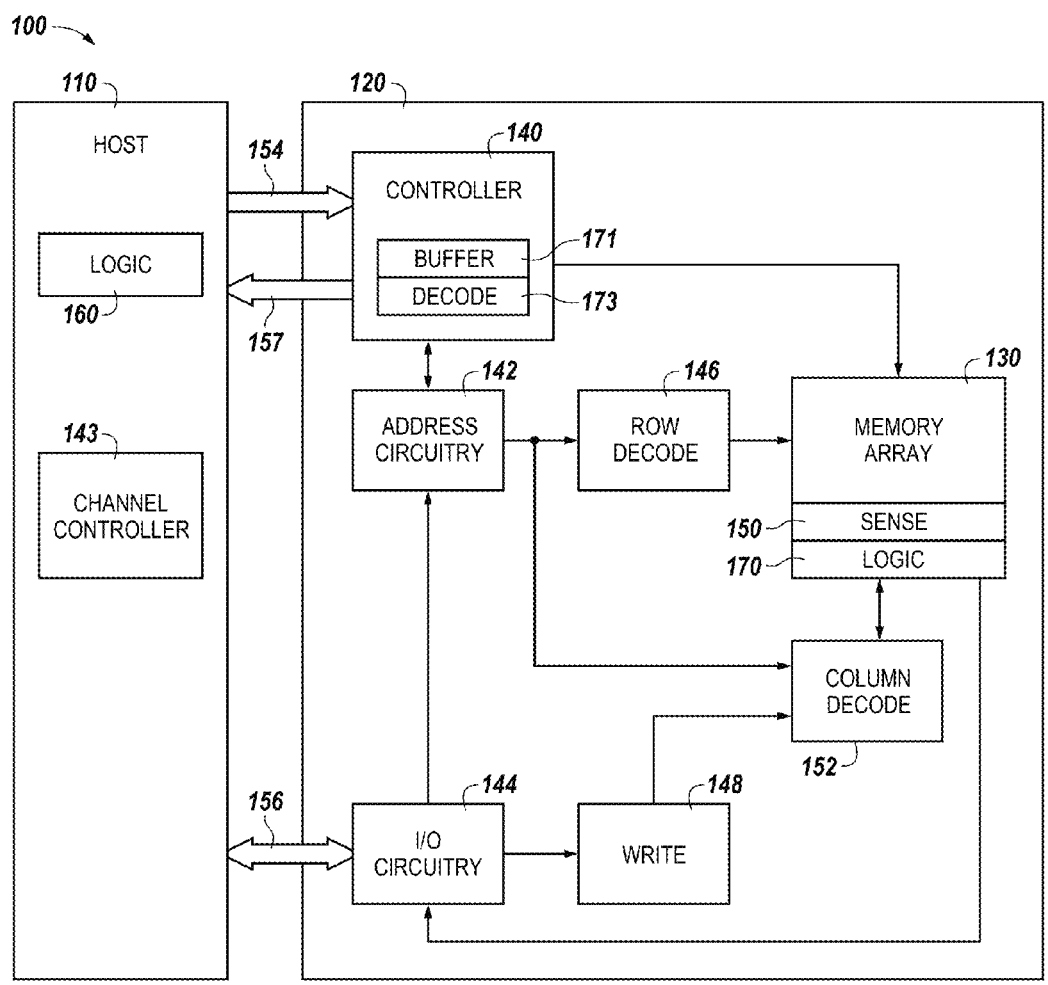
FIG. 1A is a block diagram of an apparatus in the form of a computing system including a memory device in accordance with a number of embodiments of the present disclosure.

The present disclosure includes apparatuses and methods related to a modified decode circuitry for performing a corner turn in memory. An example apparatus can comprise an array of memory cell and decode circuitry coupled to the array and including logic configured to modify an address corresponding to at least one data element in association with performing a corner turn operation on at least one data element. The logic can be configured to modify the address corresponding to the at least one data element on a per column select basis.

As an example, modified decode circuitry associated with a buffer memory such as an SRAM, for instance, can be used to perform a corner turn on data stored in a plurality of memory cells of a different memory, such as a DRAM, for instance. For example, data elements (e.g., bytes, words, etc.) can be stored in a plurality of memory cells coupled to a same access line (e.g., word line), which may be referred to as a "horizontal" storage format. Alternatively, data elements can be stored in a plurality of memory cells corresponding to a same column (e.g., same sense line and/or pair of complementary sense lines), which may be referred to as a "vertical" storage format.

In various instances, it may be beneficial to operate on data elements stored vertically in an array. For example, some memory arrays can be coupled to sensing circuitry comprising a plurality of compute components each corresponding to one of a respective plurality of columns of the array and serving as one of a respective plurality of processing resources (e.g., a plurality of 1-bit processors). In various instances, the plurality of 1-bit processors can operate in parallel on data elements stored vertically in corresponding columns of the array. For example, the data elements can be stored such that the data units (e.g., bits) of a particular data element (e.g., word) are stored at successive addresses in the memory space corresponding to a particular processing resource. In this manner, in an array comprising 16K columns, 16K vertically stored data units could be processed in parallel by the corresponding 16K 1-bit processors (see FIG. 1B).

A number of embodiments of the present disclosure perform address modifications on data to facilitate performing corner turn operations (e.g., to facilitate adjustment of data from a horizontal storage format to a vertical storage format, and vice versa). Embodiments of the present disclosure can provide benefits such as performing corner turn operations in a more efficient manner and/or using less circuitry (e.g., less complex decode circuitry and/or fewer instances of the decode circuitry) as compared to previous approaches, among other benefits. In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "R," "S," "U," "V," "W," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 171 may reference element "71" in FIG. 1A, and a similar element may be referenced as 571 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, buffer 171, and decode circuitry 173 might also be separately considered an "apparatus."

Figure 1B:
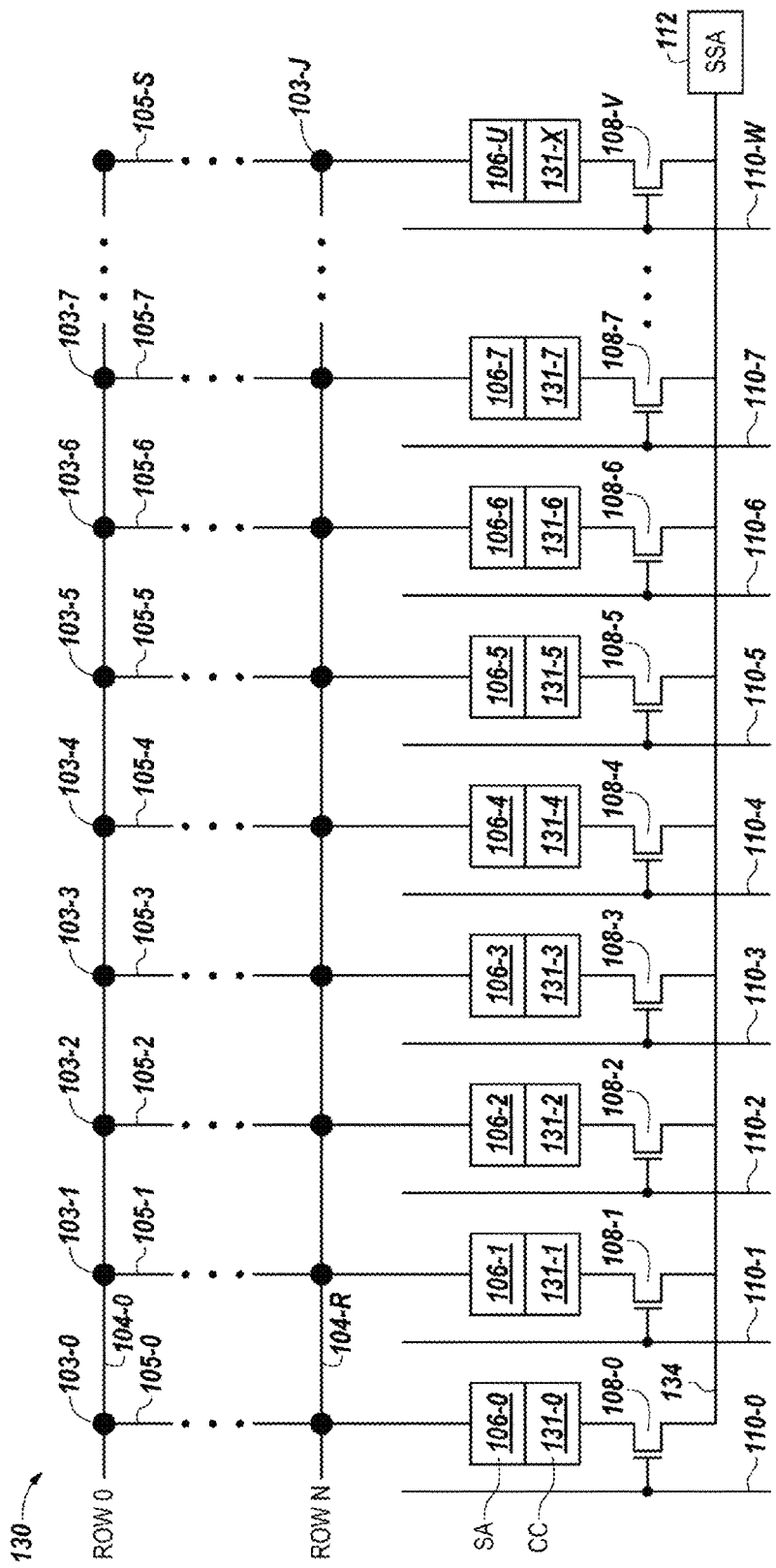
FIG. 1B is a schematic diagram of a portion of a memory array in accordance with a number of embodiments of the present disclosure.

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIGS. 1A and 1B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines (which may be referred to herein as word lines or select lines) and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a bus 156 (e.g., an I/O bus) through I/O circuitry 144. Status and/or exception information can be provided from the controller 140 on the memory device 120 to a channel controller 143 and/or host 110 (e.g., through a high speed interface (HSI) including an out-of-band bus 157). Address signals are received through address circuitry 142 and decoded by a row decoder 146 and a column decoder 152 to access the memory array 130. The address signals can also be provided to controller 140. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

The controller 140 decodes signals provided by control bus 154 from the host 110. These signals can include chip enable signals, write enable signals, and address latch signals that are used to control operations performed on the memory array 130, including data read, data write, and data erase operations. In various embodiments, the memory controller 140 is responsible for executing instructions from the host 110 and sequencing access to the array 130. The controller 140 can include a buffer 171 for storing data. The buffer 171 can be an array (e.g., SRAM Cell Array 571 shown in FIG. 5) of memory cells and can be coupled to decode circuitry 173 (e.g., decode circuitry 573 shown in FIG. 5) configured to decode address signals received from address circuitry 142 (e.g., in association with performing corner turn operations as described further herein). The controller 140 can be a state machine, a sequencer, or some other type of controller. The controller 140 can control shifting data (e.g., right or left) in an array (e.g., memory array 130), as well as corner turning data in accordance with a number of embodiments described herein.

Examples of the sensing circuitry 150 can comprise a number of sense amplifiers and a number of corresponding compute components, which may serve as, and be referred to herein as, accumulators and can be used to perform logical operations (e.g., on data associated with complementary data lines).

In a number of embodiments, the sensing circuitry 150 can be used to perform logical operations using data stored in array 130 as inputs and store the results of the logical operations back to the array 130 without transferring data via a sense line address access (e.g., without firing a column decode signal). As such, various compute functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer) results of operations described herein.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations without enabling column decode lines of the array; however, the local I/O line(s) may be enabled in order to transfer a result to a suitable location other than back to the array 130 (e.g., to a buffer such as buffer 171 and/or to some other external register).

Although the channel controller 143 is illustrated as being located on the host 110, embodiments are not so limited. For instance, in a number of embodiments, the channel controller 143 may be located on (e.g., formed on a same substrate as) the memory device 120. Also, although the buffer memory 171 and corresponding decode circuitry (e.g., logic) 173 is shown as being located on controller 140 in FIG. 1A, in a number of embodiments, the buffer memory 171 and corresponding decode circuitry 173 may be located on the channel controller 143, for example.

FIG. 1B illustrates a schematic diagram of a portion of a memory array 130 in accordance with a number of embodiments of the present disclosure. The array 130 includes memory cells (referred to generally as memory cells 103, and more specifically as 103-0 to 103-J) coupled to rows of access lines 104-0, 104-1, 104-2, 104-3, 104-4, 104-5, 104-6, . . . , 104-R and columns of sense lines 105-0, 105-1, 105-2, 105-3, 105-4, 105-5, 105-6, 105-7, . . . , 105-S (referred to generally as access lines 104 and sense lines 105, respectively). Memory array 130 is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines.

Each column of memory cells can be coupled to sensing circuitry (e.g., sensing circuitry 150 shown in FIG. 1A). In this example, the sensing circuitry comprises a number of sense amplifiers 106-0, 106-1, 106-2, 106-3, 106-4, 106-5, 106-6, 106-7, . . . , 106-U (referred to generally as sense amplifiers 106) coupled to the respective sense lines 105. The sense amplifiers 106 are coupled to input/output (I/O) line 134 (e.g., a local I/O line) via access devices (e.g., transistors) 108-0, 108-1, 108-2, 108-3, 108-4, 108-5, 108-6, 108-7, . . . , 108-V. In this example, the sensing circuitry also comprises a number of compute components 131-0, 131-1, 131-2, 131-3, 131-4, 131-5, 131-6, 131-7, . . . , 131-X (referred to generally as compute components 131) coupled to the respective sense lines 105. A combination of a sense amplifier 106 and a corresponding compute component 131 can be referred to as a sensing component and can serve as a 1-bit processor. Column decode lines 110-1 to 110-W are coupled to the gates of transistors 108-1 to 108-V, respectively, and can be selectively activated to transfer data sensed by respective sense amps 106-0 to 106-U and/or stored in respective compute components 131-0 to 131-X to a secondary sense amplifier 112. In a number of embodiments, the compute components 131 can be formed on pitch with the memory cells of their corresponding columns and/or with the corresponding sense amplifiers 106. For example, in an array comprising 16K columns, 16K vertically stored data elements could be processed in parallel by the corresponding 16K 1-bit processors.

The sensing circuitry (e.g., sensing components including compute components 131 and corresponding sense amplifiers 106) can be controlled (e.g., by controller 140) to write data to and read data from the array 130. As described further below, data elements (e.g., words) may be stored in array 130 in accordance with a horizontal format or a vertical format. Data elements stored in array 130 in accordance with a vertical format can correspond to elements having undergone a corner turn operation (e.g., via buffer memory 171 and corresponding decode logic 173), in accordance with embodiments described herein, prior to being written to array 130. Similarly, data corresponding to elements stored vertically in array 130 can be read via the sensing circuitry and can be corner turned (e.g., via buffer memory 171 and corresponding decode logic 173) such that the respective data elements can be written to a particular memory (e.g., back to array 130 and/or to a different storage location) in accordance with a horizontal storage format. An example of a horizontal storage format includes data units (e.g., bits) of a data element being stored in a number of adjacent memory cells coupled to a particular access line 104 and to a plurality of sense lines 105. For instance, a first 4-bit element can be stored in a first group of four memory cells each coupled to access line 104-0 (e.g., ROW 0) and to a respective one of sense lines 105-0, 105-1, 105-2, and 105-3, and a second 4-bit element can be stored in a second group of memory cells each coupled to access line 104-1 and to a respective one of sense lines 105-0, 105-1, 105-2, and 105-3.

As noted above, in a number of embodiments, the sensing components (e.g., sense amplifiers 106 and corresponding compute components 131) can serve as 1-bit processors. Therefore, in various instances, it can be beneficial to store elements in array 130 in accordance with a vertical storage format (e.g., in order for the 1-bit processors to operate on a plurality of elements in parallel). As such, performing a corner turn on data such that elements are stored vertically in an array (e.g., 130) can be beneficial. As an example, a corner turn can be performed on the two horizontally stored 4-bit elements described above by reading the horizontally stored elements out of the array 130 (e.g., via sensing circuitry 150), using the buffer memory 171 and corresponding decode logic 173 to perform a corner turn on the two elements (e.g., as described further below), and then writing the two corner turned 4-bit elements back to array 130 (e.g., such that the elements are stored vertically). For instance, the first corner turned 4-bit element could be stored in cells coupled to sense line 105-0 and to access lines 104-0, 104-1, 104-2, and 104-3, and the second corner turned 4-bit element could be stored in cells coupled to sense line 105-1 and to access lines 104-0, 104-1, 104-2, and 104-3.

Figures 2A, 2B:
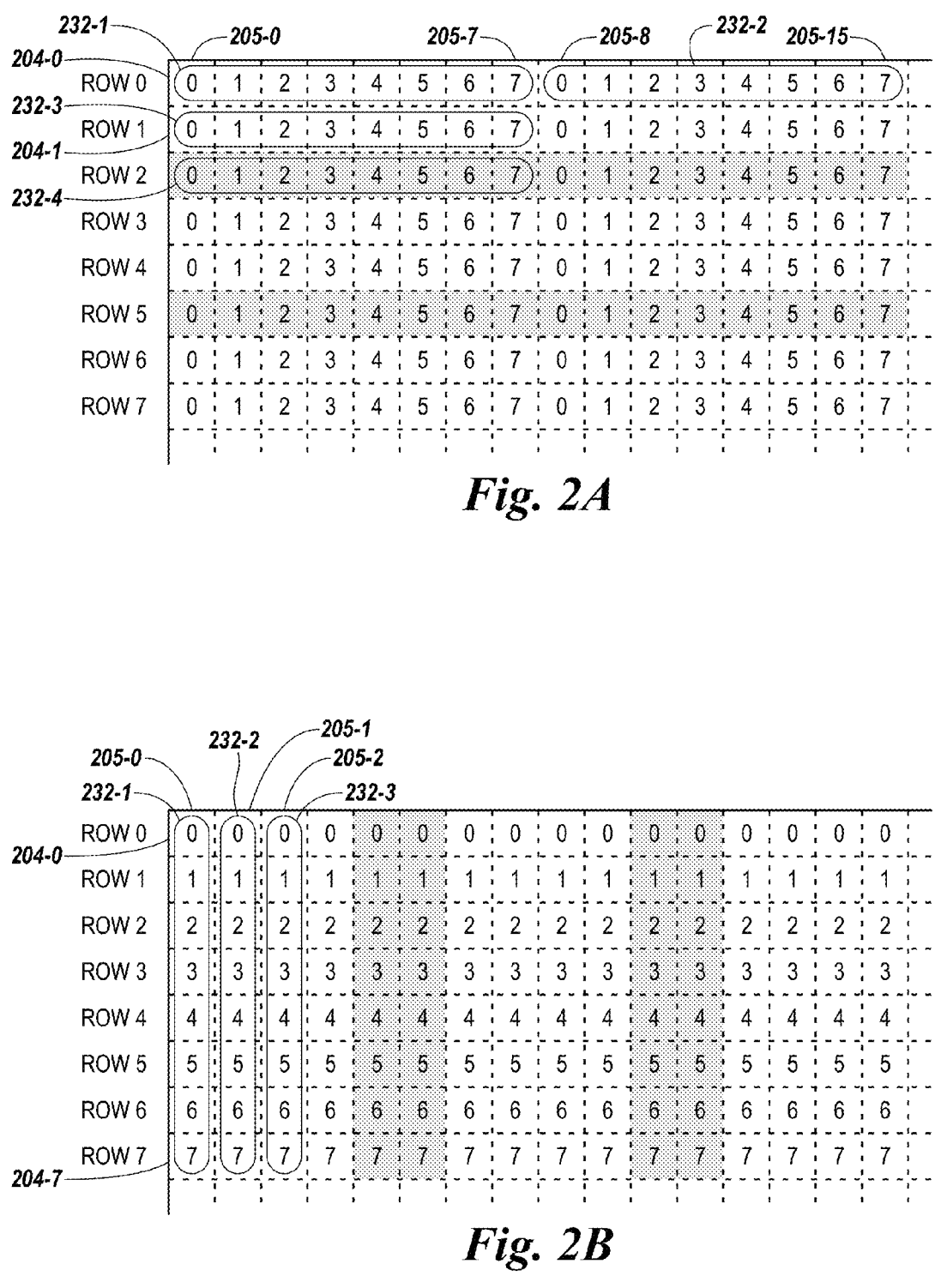

FIGS. 2A and 2B illustrate data stored in an array in accordance with a particular storage format. Specifically, FIG. 2A illustrates an example of data stored in memory in accordance with a horizontal storage format, and FIG. 2B illustrates an example of data stored in memory in accordance with a vertical storage format. As an example, the vertically stored data elements (e.g., byte, word, etc.) shown in FIG. 2B can correspond to the horizontally stored elements shown in FIG. 2A subsequent to being corner turned in accordance with embodiments described herein. In the example shown in FIGS. 2A and 2B, each of the data elements comprises eight data units (e.g., 8 bits); however, embodiments are limited neither to a particular data element size (e.g., data elements can comprise more or fewer than 8 bits) nor to data elements having a same size (e.g., different data elements can have different sizes). In this example, the bits of the data elements 232-1, 232-2, 232-3, 232-4 are labeled "0", "1," "2," "3," "4," "5," "6," and "7" with "0" representing a least significant bit (LSB) position and "7" representing a most significant bit (MSB) position. While the LSB is illustrated as being the leftmost bit in FIG. 2A, embodiments are not so limited. For example, in some embodiments, the LSB can be the right-most bit.

As shown in FIG. 2A, data elements 232-1 and 232-2 are stored horizontally in row 204-0 (ROW 0) of the array. As such, the eight successive bits of data element 232-1 are stored in consecutive memory cells corresponding to ROW 0 and to a first eight columns of the array (e.g., columns 205-0 to 205-7), and the eight successive bits of data element 232-2 are stored in memory cells corresponding to row 204-0 (ROW 0) and to a next 8 columns of the array (e.g., columns 205-8 to 205-15). For example, bit "0" of element 232-1 is stored in a memory cell that is coupled to an access line (e.g., access line 104-0 in FIG. 1) corresponding to ROW 0 and that is coupled to a sense line corresponding to a first column 205-0 (e.g., sense line 104-0 in FIG. 1), bit "1" of element 232-1 is stored in a memory cell that is coupled to the access line (e.g., 104-0) corresponding to ROW 0 and that is coupled to a sense line (e.g., sense line 105-1 in FIG. 1) corresponding to an adjacent column (e.g., a second column), etc. Similarly, bit "0" of element 232-2 is stored in a memory cell that is coupled to the access line corresponding to ROW 0 and that is coupled to a sense line corresponding to a ninth column 205-8, bit "1" of element 232-2 is stored in a memory cell that is coupled to the access line corresponding to ROW 0 and that is coupled to a sense line corresponding to a tenth column, and so forth.

As shown in FIG. 2A, element 232-3 is stored horizontally in row 204-1 (ROW 1) of the array. For instance, bit "0" of element 232-3 is stored in a memory cell that is coupled to an access line corresponding to ROW 1 and that is coupled to a sense line (e.g., or pair of complementary sense lines) corresponding to the first column 205-0. For example, the memory cells storing bit "0" of elements 232-1 and 232-3 are coupled to a same sense line (e.g., column 205-0). Bit "1" of element 232-3 is stored in a memory cell coupled to the access line corresponding to ROW 1 and that is coupled to a sense line corresponding to the second column. For example, the memory cells storing bit "1" of elements 232-1 and 232-3 are coupled to a same sense line. Similarly, in the example shown in FIG. 2A, bit "2" to bit "7" of elements 232-1 and 232-3 are stored in memory cells corresponding to a same respective column (e.g., bit "2" of each of element 232-1 and 232-3 are stored in respective memory cells coupled to a same sense line, bit "3" of each element 232-1 and 232-3 are stored in respective memory cells coupled to a same sense line, etc.). In the example shown in FIG. 2A, element 232-4 is stored horizontally in ROW 2 such that each of its constituent bits are stored in memory cells coupled to an access line corresponding to ROW 2. The memory cells storing bit "0" to bit "7" of element 232-4 are also coupled to the same respective sense lines as the respective memory cells storing bit "0" to bit "7" of elements 232-1 and 232-3. Although the rows 204 are shown as being physically adjacent, and the data elements 232 are shown as being stored in physically adjacent columns, embodiments are not so limited. For instance, the rows 204 may be logically adjacent without being physically adjacent. Similarly, the cells in which the data elements are stored may be logically adjacent without being physically adjacent.

As shown in FIG. 2B, the data units (e.g., bits) of a particular data element (e.g., byte, word, etc.) are stored in memory cells corresponding to a same column (e.g., a same sense line and/or pair of complementary sense lines). In various instances, each column of an array can have a respective processing resource (e.g., a 1-bit processor such as corresponding sense amplifiers 106 and compute components 131 for each column) associated therewith. In such instances, each column can be considered the memory space of a particular corresponding processing resource. Therefore, storing elements vertically can include storing the elements such that the successive bits of each respective one of the data elements (e.g., 232-1, 232-2, 232-3) are stored at successive addresses in the memory space of a corresponding processing resource.

As shown in FIG. 2B, the bits of element 232-1 (e.g., bits "0" to "7") are stored in memory cells that correspond to a same column 205-0 (e.g., memory cells commonly coupled to a first sense line such as 104-0 in FIG. 1) and that are coupled to a plurality of access lines corresponding to ROW 0 to ROW 7 (e.g., access lines 104-0 to 104-7 in FIG. 1). Similarly, the bits of element 232-2 are stored in memory cells that correspond to a same column 205-1 and that are coupled to the plurality of access lines corresponding to ROW 0 to ROW 7, and the bits of element 232-3 are stored in memory cells that correspond to a same column 205-2 and that are coupled to the plurality of access lines corresponding to ROW 0 to ROW 7.

Figure 4:
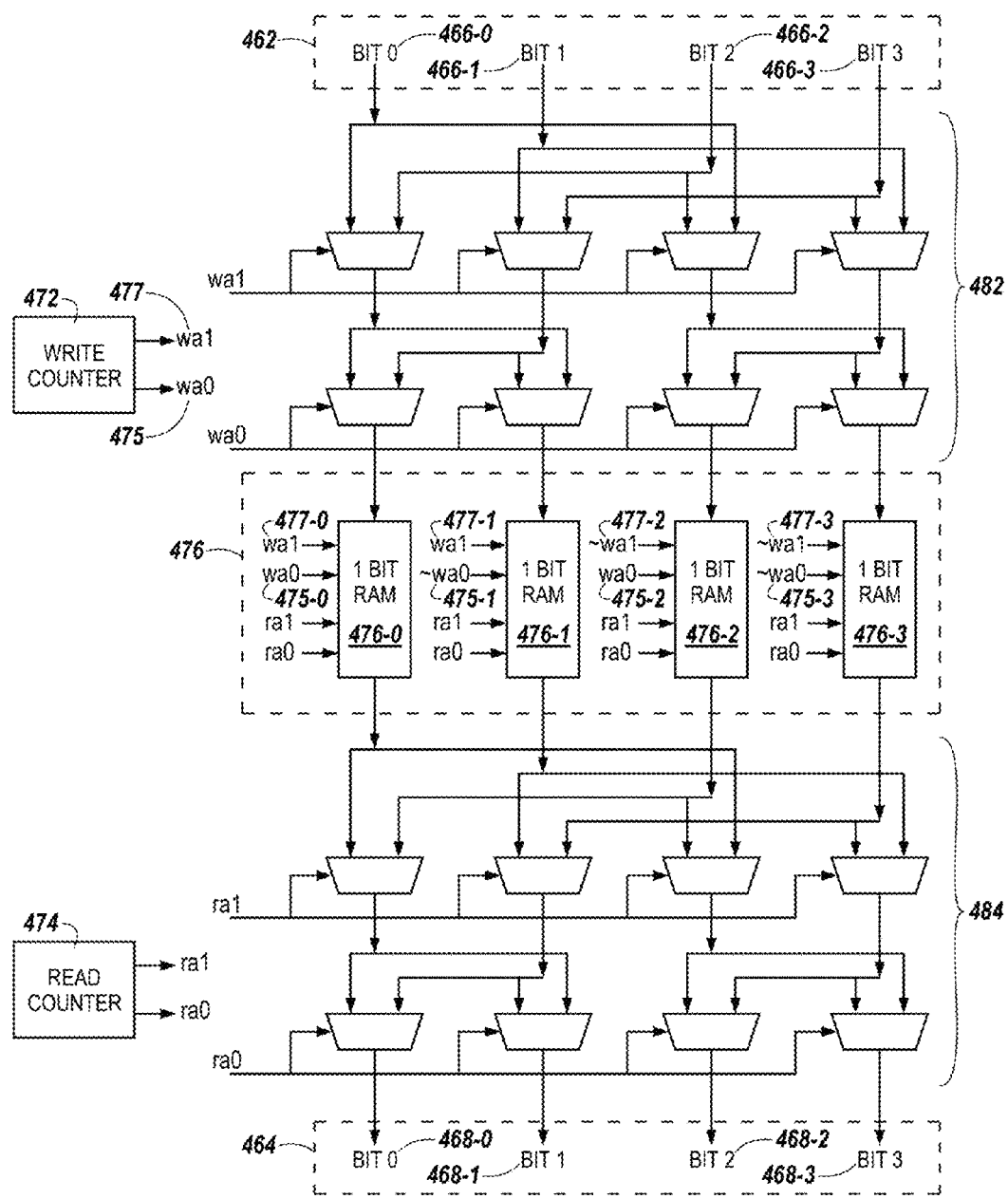
FIG. 4 is a schematic diagram illustrating a portion of a memory array and corresponding decode circuitry associated with performing a corner turn on data.
Figure 5:
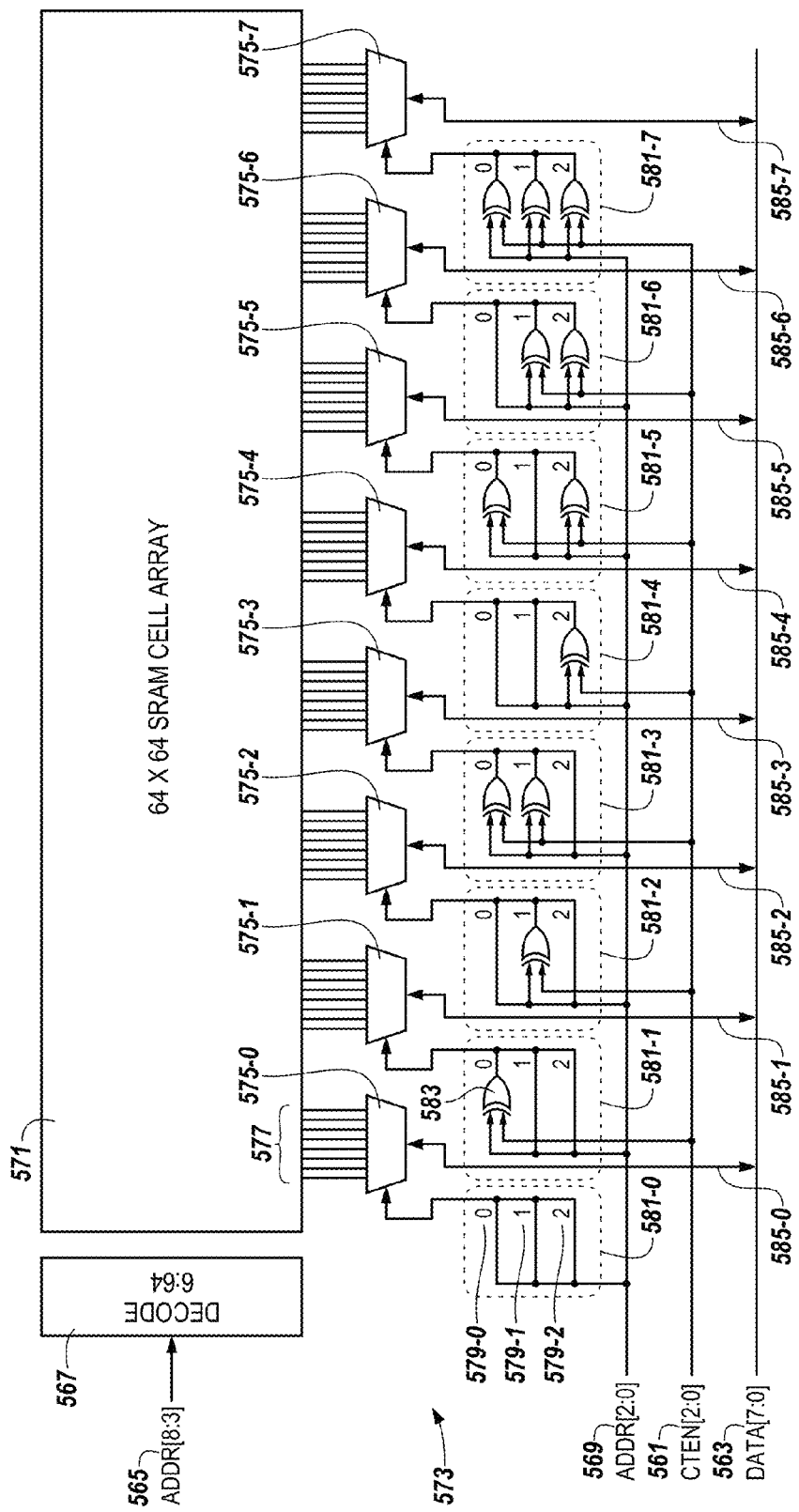
FIG. 5 is a schematic diagram illustrating a memory array coupled to decode circuitry in accordance with a number of embodiments of the present disclosure.

FIG. 3A illustrates a number of data elements stored horizontally prior to being corner turned (e.g., via the 1-bit memories and corresponding decode circuitry shown in FIG. 4). FIG. 3B illustrates the data elements shown in FIG. 3A stored in a buffer memory (e.g., buffer memory 171 such as an SRAM, which may be referred to as a corner turn buffer) in association with a corner turn operation (e.g., subsequent to reorganization of the constituent data units of the respective data elements via the corner turn decode circuitry shown in FIG. 4). FIG. 3C illustrates the number of data elements stored vertically subsequent to being read out of the buffer memory in association with a corner turn operation (e.g., subsequent to reorganization of the constituent data units of the data elements via the corner turn decode circuitry shown in FIG. 4). The example described in FIGS. 3A-3C and FIG. 4 involves four (4) 4-bit elements associated with corner turning as may have been used in previous approaches. One of ordinary skill in the art will appreciate that the example corner turn operation described in association with FIGS. 3A-3C and 4 is often attributed to Kenneth E. Batcher and may be referred to as a "Batcher corner turn" operation. Embodiments of the present disclosure are not limited to a particular size and/or number of data elements. An example of modified decode circuitry associated with a number of embodiments of the present disclosure is shown in FIG. 5 and described further below.

The identifiers used in FIGS. 3A-3C comprise a first digit which indicates a particular one of the data elements (e.g., words) and a second digit which indicates a particular one of the data units (e.g., bits) within the particular data element. For example, K:L would indicate the "Lth" bit of the "Kth" data element. The 16 cells shown in FIGS. 3A, 3B, and 3C can be uniquely addressed via respective column and row addresses 336 and 337. As described in FIG. 3B, each column address 336-0 (binary "00" corresponding to decimal "0"), 336-1 (binary "01" corresponding to decimal "1"), 336-2 (binary "10" corresponding to decimal "2"), and 336-3 (binary "11" corresponding to decimal "3") can also correspond to a memory address (e.g., since each column 333 can correspond to the memory space of a respective 1-bit processing resource). Row addresses 337-0 ("00"), 337-1 ("01"), 337-2 ("10"), and 337-3 ("11") are also shown as corresponding to an indicated row (e.g., "00" is row 0, "01" is row 1, "10" is row 2, and "11" is row 3).

As shown in FIG. 3A, each "nth" element is stored in an "nth" row of cells and each nth data unit of a corresponding element is stored in an nth column of cells. For example, FIG. 3A includes a data element (e.g., a "zeroth" data element) stored in cells coupled to access line (e.g., row) 335-0, a data element (e.g., a first data element) stored in cells coupled to access line 335-1, a data element (e.g., a second data element) stored in cells coupled to access line 335-2, and a data element (e.g., a third data element) stored in cells coupled to access line 335-3. In this example, bit "0" (e.g., the zeroth bit) of each of the four data elements is coupled to a respective cell corresponding to column 333-0, bit "1" of each of the four data elements is coupled to a respective cell corresponding to column 333-1, bit "2" of each of the four data elements is coupled to a respective cell corresponding to column 333-2, and bit "3" of each of the four data elements is coupled to a respective cell corresponding to column 333-3.

In various previous approaches, N memories (e.g., N 1-bit RAMs) might be used to perform a corner turn on an N-bit data stream, with N being some power of 2. The example described in FIGS. 3A-3C corresponds to a 4-bit data stream (e.g., N=4). Therefore, according to such previous approaches, corner turning the four elements shown in the example above may have used four 1-bit memories (e.g., memories 476-0 to 476-3 and corresponding decode circuitry such as that shown in FIG. 4), which each could correspond to a respective processing resource (e.g., bit-serial processor). As described below, corner turning the four data elements shown in FIG. 3A can include writing the elements (e.g., to a buffer memory) in a particular manner based on write addresses corresponding to the respective elements, addresses corresponding to the respective N memories (e.g., column addresses), and positions of the constituent bits within the respective elements.

FIG. 3B is an example of the four data elements shown in FIG. 3A stored in an intermediate storage format (e.g., a storage format in which the data elements are organized such that they are not oriented horizontally or vertically) within a buffer memory (e.g., buffer 171) in association with a corner turn operation. The buffer memory represented in FIG. 3B includes four columns 333-4, 333-5, 333-6, and 333-7 and four rows 335-4, 335-5, 335-6, and 335-7. As described further in FIG. 4, each of the columns can correspond to a respective 1-bit wide memory (e.g., with an address space defined by the number of rows). In this example, the address space corresponding to each column (e.g., each 1-bit wide memory) comprises four addresses (e.g., storage locations) 337-0 ("00"), 337-1 ("01"), 337-2 ("10"), and 337-3 ("11"), which correspond to respective rows 335-4, 335-5, 335-6, and 335-7 and can be referred to as "row addresses." FIG. 3B also illustrates addresses 336-0 ("00"), 336-1 ("01"), 336-2 ("10"), and 336-3 ("11"), which correspond to respective columns 333-4, 333-5, 333-6, and 333-7 and can be referred to as "column addresses." The column addresses 336 may also be referred to as "memory numbers" since they can correspond to respective 1-bit wide memories in this example (e.g., memories 476-0, 476-1, 476-2, and 476-3 shown in FIG. 4).

As described further below in connection with FIG. 4, determining the storage locations (e.g., respective row address and column address) of the constituent bits of the data elements as shown in FIG. 3B can include performing a number of address modification operations on the incoming data elements (e.g., the data elements to be written to the buffer memory) The address modification operations can include a first modification used to determine a particular row 335 in which a particular bit is to be stored (e.g., at which particular location within the address space of a respective one of the 1-bit wide memories the bit is to be written), and a second modification used to determine a particular column 333 in which the particular bit is to be stored (e.g., into which particular one of the respective 1-bit memories the bit is to be written). As described further below, the second modification can include inverting one or more bits of the write addresses corresponding to the respective elements (e.g., words), and the first modification can include performing one or more bit swaps based on the write addresses corresponding to the respective elements. As used herein, a bit swap can refer to an exchange of bit positions within a particular word (e.g., such that the constituent bits may not be stored in an ascending sequential order).

Mathematical notation illustrating an example of a number of data elements being written to a buffer memory in accordance with a corner turn operation, such as that described in FIGS. 3A to 3C, is shown below. In the example below, each element (e.g., word) $w_i$ is represented as a bit array $b_{ij}$ where:

$$w_i = \Sigma_{j=0}^{J-1} b_{ij} \cdot 2^j$$

In this example, J words $w_{i=0 \ldots (J-1,)}$ are to be written to a J×J portion of buffer memory (e.g., J×J cells) $m_{kl}$ (k=0 ... (J−1), l=0 ... (J−1)). Each bit $b_{ij}$ is written to a cell $m_{kl}$ where:

$$k=j$$

$$l=j \oplus i,$$

which indicates that the $j^{th}$ bits of the respective words are located in a same row (e.g., k=j), where k represents the row address of the buffer memory. For example, the "$0^{th}$" bits of each of the four respective words shown in FIG. 3B are stored in the zeroth row (e.g., row 335-4 having row address "00" 337-0), the "$1^{st}$" bits of each of the four respective words are stored in the "$1^{st}$" row (e.g., row 335-5 having row address "01" 337-1), the "$2^{nd}$" bits of each of the four respective words are stored in the $2^{nd}$ row (e.g., row 335-6 having row address "10"), and the "$3^{rd}$" bits of each of the four respective words are stored in the $3^{rd}$ row (e.g., row 335-7 having row address "11"). As indicated by $l=j \oplus i$, where index l represents the particular column address (e.g., which particular one of the 1-bit memories) of the buffer memory, the particular column of the buffer memory in which a bit is stored can be determined by performing an XOR operation on index i (e.g., which indicates a particular word number) and index j (e.g., which indicates the particular bit position of a bit within the particular word). For instance, the particular column (e.g., index l) in which the $0^{th}$ bit (e.g., j=00) of the $0^{th}$ word (e.g., i=00) is stored in the buffer memory can be determined by XORing the indexes i and j corresponding to the particular bit (e.g., l=00 XOR 00). Since 00 XOR 00 equals 00, bit 0:0 (e.g., the $0^{th}$ bit of the $0^{th}$ word wi) is stored in column 00 of the buffer memory shown in FIG. 3B (e.g., column 333-4 corresponding to column address 336-0). The particular columns in which the $i^{th}$ bits of the other respective words $w_i$ are stored in the buffer memory can be determined in a similar manner.

On readout from the same J×J portion of the buffer memory (e.g., the buffer memory portion shown in FIG. 3B), new words $v_{mn}$ can be created by reading cells $m_{kl}$ and swapping data bits (e.g., exchanging positions of the data bits within a particular word via decode circuitry 484 shown in FIG. 4) such that:

$$m=k$$

$$n=l \oplus k,$$

where index "m" is the word number of the new word, index "n" is the bit position within the new word "m," index "k" is the row address corresponding to the buffer memory, and index "l" is the column address corresponding to the buffer memory. FIG. 3C illustrates the new words $v_{mn}$ being written to a memory (e.g., to a memory such as memory 130 shown in FIG. 1) subsequent to being corner turned such that the words $w_i$, which are shown stored horizontally in FIG. 3A, are stored vertically in FIG. 3C.

In FIG. 3C, the columns 333-8, 333-9, 333-10, and 333-11 represent a respective zeroth ($0^{th}$), first ($1^{st}$), second ($2^{nd}$), and third ($3^{rd}$) column, and rows 335-8, 335-9, 335-10, and 335-11 represent a respective ($0^{th}$), first ($1^{st}$), second ($2^{nd}$), and third ($3^{rd}$) row. As such, a $0^{th}$ new word (e.g., m=00) is stored in the cells coupled to row 335-8, a $1^{st}$ new word (e.g., m=01) is stored in the cells coupled to row 335-9, a $2^{nd}$ new word (e.g., m=10) is stored in the cells coupled to row 335-10, and a $3^{rd}$ new word (e.g., m=11) is stored in the cells coupled to row 335-11. The particular locations of the constituent bits of the words $w_i$ within the array shown in FIG. 3C can be determined as described by the equations above.

For instance, the new word number (e.g., m) is equal to the row address (e.g., index k) of the buffer memory (e.g., since m=k). Therefore, each of the bits stored in row 335-4 (e.g., corresponding to index k=00) of the buffer memory (e.g., bits 0:0, 1:0, 2:0, and 3:0) shown in FIG. 3B correspond to the $0^{th}$ new word (e.g., m=00), each of the bits stored in row 335-5 (e.g., corresponding to index k=01) of the buffer memory (e.g., bits 1:1, 0:1, 3:1, and 2:1) shown in FIG. 3B correspond to the $1^{st}$ new word (e.g., m=01), each of the bits stored in row 335-6 (e.g., corresponding to index k=10) of the buffer memory (e.g., bits 2:2, 3:2, 0:2, and 1:2) shown in FIG. 3B correspond to the $2^{nd}$ new word (e.g., m=10), and each of the bits stored in row 335-7 (e.g., corresponding to index k=11) of the buffer memory (e.g., bits 3:3, 2:3, 1:3, and 0:3) shown in FIG. 3B correspond to the $3^{rd}$ new word (e.g., m=11).

The positions of the constituent bits within the new words (e.g., as indicated by index n) is determined by "XORing" the column address (e.g., index l) and row address (e.g., index k) corresponding to a particular bit stored in the buffer memory shown in FIG. 3B. For example, the bit position (e.g., n) of bit 3:1 (which corresponds to row address k=01 and column address l=10 as shown in FIG. 3B) within new word $v_{mn}$ is "11" (since 01 XOR 10=11). Therefore, as shown in FIG. 3C, bit 3:1 is located in bit position n=11 (e.g., column 333-11) of the new word stored in row 335-9 (e.g., new word $v_{mn}$ with m=01 and n=11). The positions of the constituent bits within the respective zeroth ($0^{th}$), first ($1^{st}$), second ($2^{nd}$), and third ($3^{rd}$) new words shown in FIG. 3C can be determined in a similar manner.

As such, in the mathematical notation above, $l=j \oplus i$ can be associated with an address modification used to determine (e.g., designate) a particular memory (e.g., a particular column in this example) in which a particular bit is to be stored when written to a buffer memory in association with a corner turn operation. Similarly, the mathematical notation above, $n=l \oplus k$ can be associated with an address modification used to determine a particular memory (e.g., a particular column in this example) in which a particular bit is to be stored when read from a buffer memory and stored in a different memory in association with a corner turn operation. As described further in FIG. 4, an XOR operation performed on addresses (e.g., address bits) results in inverting (or not) the address bits. For example, XORing "00" with the two least significant bits (LSBs) of an address (e.g., 00, 01, 10, or 11) results in neither of the address bits being inverted, XORing "01" with the two LSBs of an address results in the least significant address bit being inverted (e.g., such that 00 would be 01, 01 would be 00, 10 would be 11, and 11 would be 10), XORing "10" with the two LSBs of an address results in the next to least significant address bit being inverted (e.g., such that 00 would be 10, 01 would be 11, 10 would be 00, and 11 would be 01), and XORing "11" with the two LSBs of an address results in both of the least significant address bit being inverted (e.g., such that 00 would be 11, 01 would be 10, 10 would be 01, and 11 would be 00). As such, inverting address bits (e.g., via XOR operations) can be associated with "bit swapping" since it can result in an exchange of bit positions within a particular word.

FIG. 4 is a schematic diagram illustrating a portion of a memory array and decode circuitry associated with performing a corner turn operation on data. FIG. 4 illustrates an example of circuitry that can be used to perform an N-bit (e.g., 4-bit) corner turn, such as the 4-bit corner turn described in FIGS. 3A-3C. The decode circuitry shown in FIG. 4 includes a number of multiplexers 482 used to perform address modifications on data elements 462 written to a buffer memory 476 in association with performing a corner turn operation, and a number of multiplexers 484 to perform address modifications on data read from the buffer memory 476 in association with performing the corner turn operation. In this example, the buffer memory 476 comprises four 1-bit memories (e.g., RAMs) 476-1, 476-2, 476-3, and 476-4. The decode circuitry illustrated in FIG. 4 includes a write counter 472 and a read counter 474 that can be used to increment respective write addresses comprising "wa0" 475 (e.g., a least significant write address bit) and "wa1" 477 (e.g., a next to least significant write address bit) and read addresses comprising "ra0" (e.g., a least significant read address bit) and "ra1" (e.g., a next to least significant read address bit) in association with performing a corner turn. In this example, two address bits are used to identify the write addresses (e.g., 00, 01, 10, and 11) corresponding to the four 4-bit elements 462 (e.g., the four words $w_i$ described in FIG. 3A) to be written to a buffer memory in association with a corner turn operation.

In the example shown in FIG. 4, each 4-bit element (e.g., word) 462 to be written to buffer memory 476 comprises bits 466-0 (BIT 0), 466-1 (BIT 1), 466-2 (BIT 2), and 466-3 (BIT 3). The multiplexers 482 can be used to perform bit swaps associated with respective elements 462 (e.g., to determine into which of the memories 476-0, 476-1, 476-2, and 476-3 the constituent bits 466 of a particular element 462 are to be stored) based on the corresponding write address of the element. For instance, as shown in FIG. 4, the multiplexers 482 receive the write address bits 475 (wa0) and 477 (wa1) as inputs, which can result in exchanging bit positions within a particular element (e.g., one or more bits swaps) depending on the values of write address bits 475 and 477. As such, the multiplexers 482 can be associated with performing an address modification on the elements 462 (e.g., an address modification corresponding to $l=j\oplus i$, as described in FIGS. 3A and 3B above).

An address modification based on the values of the write address bits 475 and 477 can also be used to determine the particular address within a respective one of the memories 476-0 to 476-3 at which a particular bit 466 of a word 462 is to be stored. In the example illustrated in FIG. 4, a tilde (e.g., "~") is used to indicate binary inversion. For instance, "wa0" 475-0 and "wa1" 477-0 associated with memory 476-0 indicates that neither the of the address bits 475 and 477 are modified (e.g., inverted) when writing a particular bit 466 of an element 462 to memory 476-0. However, "~wa0" 475-1 and "~wa1" 477-1 associated with memory 476-1 indicates that the address bit 475 is inverted when writing a particular bit 466 of an element 462 to memory 476-1, "wa0" 475-2 and "~wa1" 477-2 associated with memory 476-2 indicates that the address bit 477 is inverted when writing a particular bit 466 of an element 462 to memory 476-2, and "~wa0" 475-3 and "~wa1" 477-3 associated with memory 476-3 indicates that both of the address bits 475 and 477 are inverted when writing a particular bit 466 of an element 462 to memory 476-3. As such, the inverts of the write address bits discussed above can be associated with performing an address modification on the elements 462 (e.g., an address modification corresponding to k=j, as described in FIGS. 3A and 3B above).

It is noted that in the example shown in FIG. 4, invert operations are performed on write addresses in association with writing the words 462 to buffer memory 476. However, embodiments are not so limited. For instance, in a number of embodiments, the invert operations may instead be performed on the read addresses in association with reading the data out of the buffer memory 476. In either case (e.g., whether the invert operations are performed on the write addresses or the read addresses), the multiplexers 484 can be associated with performing bit swaps on the words (e.g., 464) read from buffer memory 476 based on the read address bits (e.g., ra0 and ra1). The words 464 comprise bits 468-0 (BIT 0), 468-1 (BIT 1), 468-2 (BIT 2), and 468-3 (BIT 3) and correspond to the new words $v_{mn}$, which can be read from a buffer memory 476 (e.g., a buffer memory such as that shown in FIG. 3B) and can be written to a different memory (e.g., a memory other than buffer memory 476) such that the original words 462 are stored vertically in the different memory (e.g., after the modified words 464 are written to the different memory as shown in FIG. 3C).

In the example shown in FIG. 4, each of the 1-bit memories 476-0, 476-1, 476-2, and 476-3 has a row decode used to access the respective memory. For instance, a zeroth decoder is associated with address bits 475-0/477-0 corresponding to memory 476-0, a first decoder is associated with address bits 475-1/477-1 corresponding to memory 476-1, a second decoder is associated with address bits 475-2/477-2 corresponding to memory 476-2, and a third decoder is associated with address bits 475-3/477-3 corresponding to memory 476-3. However, row decode circuitry can occupy relatively large amounts of area in relation to the size of the memories. As such, repeating the row decode circuitry per memory (e.g., providing a separate row decode for each of the 1-bit memories 476-0 to 476-3) can result in undesirable amount of area occupied by a buffer memory such as buffer memory 476.

The Batcher corner turn example described in FIGS. 3A-3C and FIG. 4 involves a 1:1 ratio of element width to memories (e.g., N-bit wide words are corner turned via a buffer memory comprising N 1-bit memories). As described further below, a number of embodiments of the present disclosure can provide benefits such as reducing the amount of decode circuitry associated with performing corner turn operations as compared to previous approaches, among various other benefits. For instance, as described in FIG. 5, a number of embodiments can include providing modified decode circuitry used to perform at least a portion of a corner turn operation. As an example, a number of embodiments can include the use of an N-bit wide memory to perform a corner turn on a N-bit wide word, which can reduce the instances of decode logic by a factor of N as compared to previous approaches. For instance, for N=8, the instances of decode logic associated with a corner turn operation can be reduced by a factor of 8 as compared to previous approaches (e.g., since a single decode circuit can be used for the 8-bit wide memory rather than being repeated for each of eight 1-bit memories such as in the Batcher corner turn example described above).

FIG. 5 is a schematic diagram illustrating a memory array 571 coupled to decode circuitry 573 in accordance with a number of embodiments of the present disclosure. The array 571 can be a buffer array (e.g., buffer 171 shown in FIG. 1A) and can be a bi-directional buffer allowing for reading and/or writing data in association with performing corner turn operations as described herein. In the example shown in FIG. 5, the array 571 is a 64×64 SRAM array; however, embodiments are not limited to a particular type of array and/or to the array dimensions shown.

The decode circuitry 573 can be decode circuitry such as decode circuitry 173 shown in FIG. 1A. In this example, the decode circuitry 573 includes row decode circuitry 567 associated with accessing selected access lines (e.g., rows) of array 571 by decoding address signals 565 (e.g., corresponding to six address bits shown as ADDR[8:3] in FIG. 5) provided thereto. In this example, the decode circuitry 573 includes a number of column select components 575-0 to 575-7 (referred to generally as column select components 575). In the example shown in FIG. 5, the column select components are N:1 multiplexors 575 that each function to select one of a respective group of eight columns 577 (e.g., N=8) in order to output a single data bit on a respective data line 585-0 to 585-7 or in order to receive a single data bit on the respective data line 585. The bits on respective data lines 585-0 to 585-7 comprise the eight data signals 563 (e.g., corresponding to the eight data bits shown as DATA [7:0] in FIG. 5) shown in FIG. 5. In this example, six address bits (e.g., ADDR[8:3]) are used to select a particular one of the 64 rows (e.g., $2^6$ rows) being accessed, and three address bits (e.g., the three lowermost significant address bits ADDR[2:0]) are used to select a particular one of the eight columns 577 corresponding to the respective multiplexors 575. Embodiments are not limited to a particular number of select components (e.g., to a particular number of multiplexors 575) per memory or to a particular value of "N" (e.g., the multiplexors 575 can be 4:1, 16:1, 32:1, etc.).

The buffer array 571 can be accessed by a controller (e.g., controller 150 shown in FIG. 1A), which can include a microprocessor, memory management unit, bus transactor, etc. The controller can operate the array 571 and associated circuitry (e.g., decode circuitry 573) to read/write data from/to the array 571 in association with performing corner turn operations on the data. For example, at least a portion of a corner turn can be performed during a read operation and/or during a write operation. As an example, the data signals 563 can comprise horizontally organized data received from a host (e.g., host 110) and being written to buffer memory 571 in association with corner turning the data such that it will be organized vertically when subsequently read out of buffer memory 571 and written into a different array (e.g., array 130). Alternatively, the data signals 563 can correspond to data read from the buffer memory 571 prior to being stored vertically in the different array (e.g., array 130).

In the example shown in FIG. 5, the groups of columns 577 can be considered respective 8-bit wide memories for purposes of performing a corner turn operation (e.g., on groups of eight bits received via data lines 563) using the respective 8-bit wide memories. Each 8-bit wide memory has a corresponding 8:1 multiplexor 575, with the three address bits 569 (e.g., ADDR[2:0]) being used to select a particular one of the eight columns 577. As such, the three address bits 569 can be used to uniquely identify eight data bit locations (per row) in each of the respective 8-bit memories. In a number of embodiments of the present disclosure, the decode circuitry 573 includes logic added to multiplexor select circuitry (e.g., multiplexors 575-0 to 575-7) that can be used to perform at least a portion of the address modification associated with corner turning data via the buffer memory 571. As described further below, in this example, the additional logic includes a number of logic gates 583 (e.g., "XOR" gates) that can be controlled to invert (e.g., via binary inversion) certain address bits (e.g., certain bits of address bits ADDR[2:0]) depending on the particular 8-bit memory (e.g., on a per 8-bit memory basis) and on the values of a number of enable bits (e.g., CTEN[2:0]), for instance.

Figure 6A:
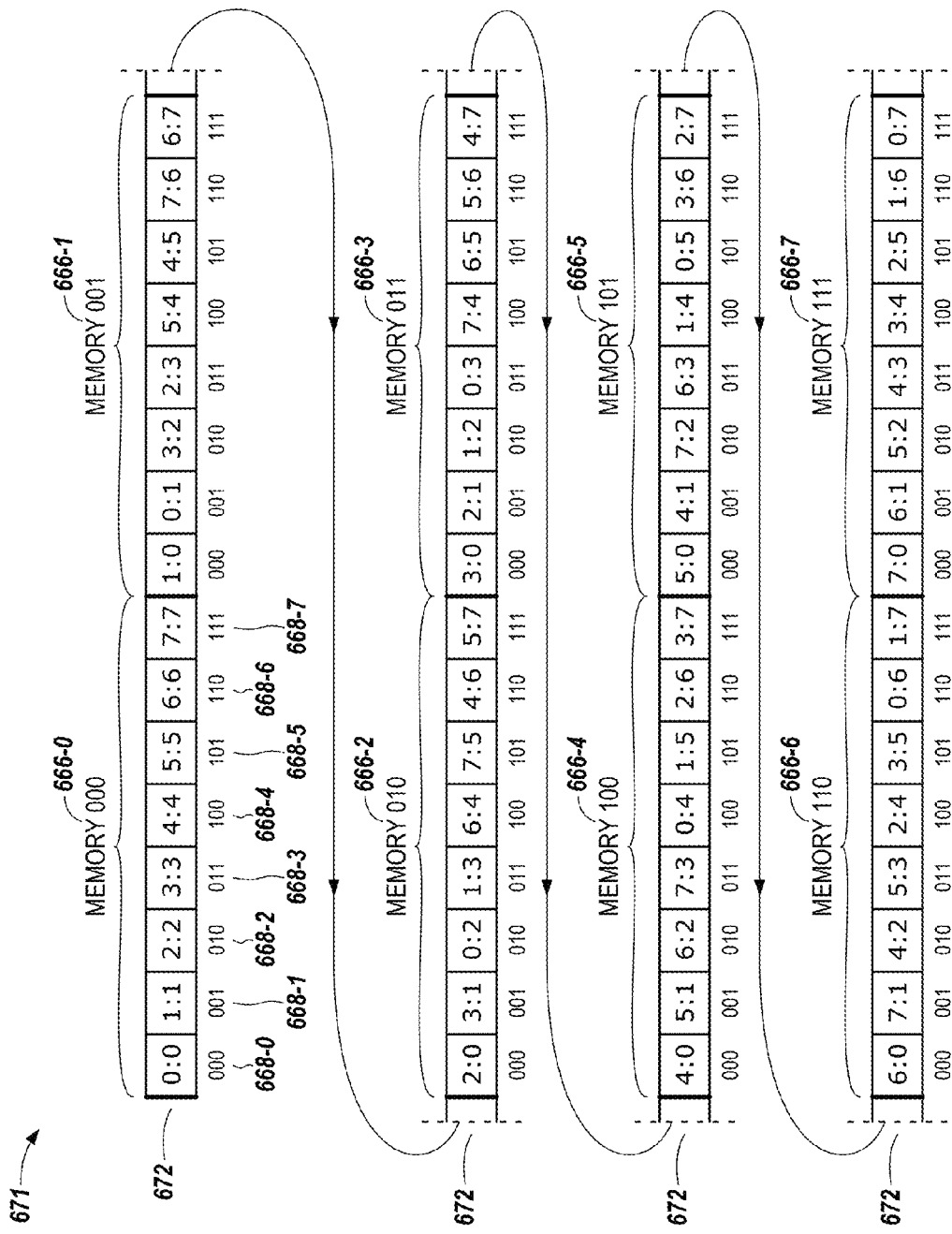
FIG. 6A illustrates a number of data elements stored in an array in association with performing a corner turn operation in accordance with a number of embodiments of the present disclosure.

The three address bits 569 used to select a particular one of the columns 577 from the respective 8-bit memories shown in FIG. 5 can identify the locations of eight ($2^3$) data units (per row) within each of the respective 8-bit memories. For instance, address bits 569 comprising "000" can be provided to the multiplexors 575 to select the zeroth column (e.g., column "000" as shown in FIG. 6A) of the respective columns 577. Similarly, address bits 569 comprising "001" can be provided to the multiplexors 575 to select the first column (e.g., column "001" as shown in FIG. 6A) of the respective columns 577, etc. As an example, the columns 577 may be numbered from left to right, with "000" corresponding to leftmost column of a respective group of columns 577 and with "111" corresponding to a rightmost column of the respective group of columns 577. The leftmost columns 577 can represent a most significant bit position; however, embodiments are not limited to this example (e.g., the leftmost column can represent a least significant bit position). In a number of embodiments, an address corresponding to a data unit of an element stored in array 571 can be modified in association with a corner turn operation in order to change a location (e.g., memory cell) at which the data unit is stored. For instance, in the example shown in FIG. 5, modifying address bits 569 from "000" to "111" in association with writing an element to a respective one of the 8-bit memories can result in the data unit being stored in a cell coupled to a seventh column (e.g., a rightmost column) rather than being stored in a cell coupled to a zeroth column (e.g., leftmost column).

As described further below in association with FIGS. 6 and 7, the example illustrated in FIG. 5 can be used in association with corner turning groups of eight data bits per 8-bit wide memory. For instance, given 8-bit wide data being corner turned via buffer 571 (e.g., 8-bit wide horizontal words being turned to 8-bit wide vertical words), the eight respective 8-bit wide memories corresponding to buffer 571 can be operated to corner turn eight 8-bit wide words. As another example, given 64-bit wide data being corner turned via buffer 571 (e.g., for a 64-bit data path), the eight respective 8-bit wide memories can be operated to corner turn respective 8-bit chunks of the 64-bit wide words. In a number of embodiment, the column select multiplexors (e.g., 575) can be wider (e.g., 16:1, 32:1, 64:1, etc.) such that words larger than 8-bit words can be corner turned via buffer 571.

Address modifications (e.g., to address bits 569) associated with corner turning data via the example shown in FIG. 5 can be performed using the logic gates 583 and can be described by the relationship:

$$A'_N = A \text{ XOR}(N \text{ AND } e)$$

where "$A'_N$" is the modified address (e.g., address of respective column 577) corresponding to a bit of a word stored in memory N, "A" is the unmodified (e.g., initial) address corresponding to the bit of the word stored in memory N, "XOR" refers to an XOR logical operation, "N" represents an index (e.g., 0-7 in this example) corresponding to a particular one of the memories, "AND" refers to an AND logical operation, and "e" refers to enable bits. As such, the modified address $A'_N$ depends on the unmodified address, A, and on the value of the enable bits, e. As an example, for a 64 bit data path associated with the buffer 571 shown in FIG. 5, N varies from 0 to 7 (e.g., from binary 000 to 111 since there are eight 8-bit memories corresponding to the respective decode multiplexors 575-0 to 575-7). Therefore, 64 different modified addresses ($A'_N$) are associated with performing a corner turn on 64 data units (e.g., a 64-bit word). In a number of embodiments, the corresponding address modifications (e.g., binary inversions) are implemented via logic gates 583 coupled to the respective decode multiplexors 575. In this manner, whether or not one or more of the address bits 569 corresponding to data (e.g., 563) are modified (e.g., inverted such as via a gate 583) in association with writing data to buffer 571 can depend on which particular 8-bit memory is being accessed (e.g., written to), as well as the value of the enable bits 561.

The enable bits (e.g., the three enable bits CTEN[2:0] 561) are used to enable/disable the corner turn operation corresponding to the respective address bits ADDR[2:0] 569. For instance, if the enable bits are "111," then "N AND e" above simply returns the value of "N" (e.g., since "111" AND "N"="N"), and the corner turn associated with each of the three address bits 569 is performed. If the enable bits are "011," then a corner turn associated with only the least two significant address bits 569 would be enabled (e.g., such that a four bit corner turn rather than an eight bit corner turn could be performed). As shown in FIG. 5, the enable bits 561 are provided to the inputs of the XOR gates 583 used to invert address bits 569 provided thereto. Therefore, inversion of an address bit 569 via a corresponding gate 583 occurs if the respective enable bit 561 is set (e.g., logic "1"); otherwise, the address bit 569 remains uninverted.

As such, a particular address bit 569 provided to an XOR gate 583 will be modified (e.g., inverted) responsive to the corresponding respective enable bit 569 being set (e.g., logic 1). In FIG. 5, bit 579-0 ("0") corresponds to the LSB of the three address bits 569 (ADDR[2:0]), bit 579-1 ("1") corresponds to the next to LSB of the address bits 569, and bit 579-2 ("2") corresponds to the MSB of the address bits 569. As shown at 581-0 in FIG. 5, none of the three address bits 569 are inverted when provided to decode multiplexor 575-0. As shown at 581-1, only bit 579-0 is inverted (e.g., via an XOR gate 583) when provided to decode multiplexor 575-1. As shown at 581-2, only bit 579-1 is inverted (e.g., via an XOR gate 583) when provided to decode multiplexor 575-2. As shown at 581-3, bits 579-0 and 579-1 are inverted (e.g., via respective XOR gates 583) when provided to decode multiplexor 575-3. As shown at 581-4, only bit 579-2 is inverted (e.g., via an XOR gate 583) when provided to decode multiplexor 575-4. As shown at 581-5, bits 579-0 and 579-2 are inverted (e.g., via respective XOR gates 583) when provided to decode multiplexor 575-5. As shown at 581-6, bits 579-1 and 579-2 are inverted (e.g., via respective XOR gates 583) when provided to decode multiplexor 575-6. As shown at 581-7, each of bits 579-0, 579-2, and 579-2 are inverted (e.g., via respective XOR gates 583) when provided to decode multiplexor 575-7. Therefore, the modification of address bits 569 (which select a respective column 577) is different for each of the respective 8-bit memories.

As an example, consider an unmodified address A=000 (e.g., address bits 569 each having a value of "0"), which would, in the absence gates 583, correspond to selection of a zeroth column (e.g., column 000) of each of the respective 8-bit memories shown in FIG. 5. In accordance with the relationship above, the modified address "$A'_N$" of a bit stored in buffer 571 depends on the particular memory (N) being written to (e.g., with N=000 for the 8-bit memory corresponding to multiplexor 575-0, N=001 for the 8-bit memory corresponding to multiplexor 575-1, . . . , and N=111 for the 8-bit memory corresponding to multiplexor 575-7).

For example, for A=000 and N=000, the modified address to the corresponding bit in memory N=000 is 000 (e.g., $A'_N$=A XOR N=000 XOR 000, which yields 000). As such, for A=000, column 000 would be selected to write a data unit on data line 585-0 to memory N=000 (e.g., the address bits 569 corresponding to memory N=000 remain 000). For A=000 and N=001, the modified address of a data unit being written to memory N=001 is 001 (e.g., $A'_N$=A XOR N=000 XOR 001, which yields 001). As such, for A=000, column 001 would be selected to write a data unit on data line 585-1 to memory N=001 The modified addresses "$A'_N$" for A=000 in the other 8-bit memories (e.g., memories N=010 to N=111) can be determined in as similar manner. For example, for A=000 and N=111, the modified address of a data unit being written to memory N=111 is 111 (e.g., $A'_N$=A XOR N=000 XOR 111, which yields 111). As such, for A=000, column 111 would be selected to write a data unit on data line 585-7 to memory N=111. For the above example, we assume that the corner turn enable bits 561 are set to 111 (e.g., the corner turn is enabled for each of the corresponding address bits 569).

As another example, consider an unmodified address A=111 (e.g., address bits 569 each having a value of "1"), which would, in the absence of gates 583, correspond to selection of a seventh column (e.g., column 111) of each of the respective 8-bit memories shown in FIG. 5. In this example, for A=111 and N=000, the modified address of a data unit being written to memory N=000 is 111 (e.g., $A'_N$=A XOR N=111 XOR 000, which yields 111). As such, for A=111, column 111 would be selected to write a data unit on data line 585-0 to memory N=000 (e.g., the address bits 569 corresponding memory N=000 remain 111). For A=111 and N=001, the modified address of a data unit being written to N=001 is 001 (e.g., $A'_N$=A XOR N=111 XOR 001, which yields 110). As such, for A=111, column 110 would be selected to write a data unit on data line 585-1 to memory N=001. The modified addresses "$A'_N$" to the corresponding bits for A=111 in the other 8-bit memories (e.g., memories N=010 to N=111) can be determined in as similar manner. For example, for A=111 and N=111, the modified address of a data unit being written to memory N=111 is 000 (e.g., $A'_N$=A XOR N=111 XOR 111, which yields 000). As such, for A=111, column 000 would be selected to write a data unit on data line 585-7 to memory N=111. For the above example, we assume that the corner turn enable bits 561 are set to 111 (e.g., the corner turn is enabled for each of the corresponding address bits 569). It is noted that the address bits 569 correspond to the words being written to buffer 571. For instance A=000 corresponds to a zeroth word (e.g., word "0"), A=001 corresponds to a first word (e.g., word "1"), . . . , A=111 corresponds to a seventh word (e.g., word "7"). Also, it is noted that the address inversions associated with decode circuitry 573 result in the "nth" bits of each of the eight words being stored in a respective "nth" column of the N memories (e.g., column 000 in each of the N memories stores a respective bit "0" from one of the eight words, column 001 in each of the N memories stores a respective bit "1" from one of the eight words, . . . , column 111 in each of the N memories stores a respective bit "7" from one of the eight words. As described herein, a particular one of the N (e.g., 8 in this example) memories in which a bit is stored in association with a corner turn operation can be determined can be determined in accordance with a number of bit swaps, which may depend on the particular word (e.g., write address) and bit number within the word.

Although not shown in FIG. 5, the decode circuitry 573 can include additional logic used to perform a portion of a corner turn operation on data. For example, the decode circuitry can include a plurality of multiplexors such as 482 and 484 described in FIG. 4, which can be used to perform bit swaps as described above. For example, the data lines 585-0 to 585-7 can be coupled to a multiplexor network which can modify the particular column select multiplexor 575-0 to 575-7 to which data 563 present on the respective data lines 585-0 to 585-7 is provided. As described above in association with FIGS. 3 and 4, the bit swapping can occur in association with writing data to buffer memory 571 and in association with reading data from buffer memory 571. The particular swapping associated with data 563 can be determined based on the address 569 and on the bit number (e.g., bit "0" through bit "7"). For example the particular memory N to which a particular bit of data 563 is written can be described by the relationship N=A XOR n where "A" is the write address and "n" is the bit number. As an example, for address A=010 (e.g., the write address of a second word 563) and n=111 (e.g., bit "7" of the word 563), bit "7" of word 010 would be written to memory N=101 in association with corner turning data via buffer 571 (e.g., since 010 XOR 111 is 101). Therefore, the bit swapping associated with A=010 results in bit "7" of word 010 being written to memory 101, and, due to the corresponding address modification logic 581-7, bit "7" of the word 010 being written to column 111 of memory 101 (e.g., since 010 XOR 101=111).

FIG. 6A illustrates a number of data elements stored in an array in association with performing a corner turn operation in accordance with a number of embodiments of the present disclosure. The example illustrated in FIG. 6A corresponds to corner turning groups of eight data bits per 8-bit wide memory, such as described in association with FIG. 5 above. FIG. 6A includes a buffer memory 671 used in association with corner turning data. The buffer memory 671 can represent a portion of buffer memory 571 shown in FIG. 5. For instance, buffer memory includes eight 8-bit wide memories 666-0 (MEMORY 000), 666-1 (MEMORY 001), 666-2 (MEMORY 010), 666-3 (MEMORY 011), 666-4 (MEMORY 100), 666-5 (MEMORY 101), 666-6 (MEMORY 110), and 666-7 (MEMORY 111). The buffer memory 671 can be coupled to decode circuitry such as decode circuitry 573 shown in FIG. 5 (e.g., such that each memory 666-0 to 666-7 is coupled to a respective decode multiplexor such as 575-0 to 575-7). In the example shown in FIG. 6A, only a single row 672 of memory cells of the buffer 671 is shown; however, embodiments can include more than one row. Also, in this example, the buffer 671 includes 64 columns of cells, with eight columns 668-0, 668-1, 668-2, 668-3, 668-4, 668-5, 668-6, and 668-7 corresponding to each of the memories 666-0 to 666-7 being numbered "000" through "111," respectively.

As an example, given 8-bit wide data being corner turned via buffer 671 (e.g., 8-bit wide horizontal words being turned to 8-bit wide vertical words), the eight respective 8-bit wide memories 666-0 to 666-7 can be operated to corner turn eight 8-bit wide words. As another example, given 64-bit wide data being corner turned via buffer 671 (e.g., for a 64-bit data path), the eight respective 8-bit wide memories 666-0 to 666-7 can be operated to corner turn respective 8-bit chunks of the 64-bit wide words.

As described above in association with FIG. 5, the addresses corresponding to particular bits being written to a buffer (e.g., 571/671) in association with a corner turn operation can be modified depending on into which particular memory (e.g., 666-0 to 666-7) the data is being written. For example, the modified address ($A'_N$) corresponding to a bit stored in memory N can be determined via the relationship $A'_N$=A XOR (N AND e), where A is the unmodified (e.g., initial) address corresponding to the bit stored in memory N, and "e" represents enable bits (e.g., CTEN[2:0] 561 shown in FIG. 5).

FIG. 6A illustrates eight groups of eight bits as written to the respective memories 666-0 to 666-7 in association with a corner turn operation using modified decode circuitry such as circuitry 573 shown in FIG. 5. The eight bits are numbered "0" through "7," with bit "0" corresponding to a LSB and bit "7" corresponding to a MSB of the eight bits written to a respective memory 666-0 to 666-7. However, embodiments are not limited to a particular ordering of bits. As described in FIG. 5, three address bits (e.g., 561 shown in FIG. 5) can be used to identify the eight (e.g., $2^3$) locations (e.g., columns 668-0 to 668-7) of the bits "0" through "7" in each of the respective memories 666-0 to 666-7. The identifiers used in FIG. 6A are similar to those used in FIGS. 3A-3C, with a first digit indicating a particular one of the data elements (e.g., words) and a second digit indicating a particular one of the data units (e.g., bits) within the particular data element. For example, K:L would indicate the "Lth" bit of the "Kth" data element. In this example, each 8-bit wide memory 666-0 to 666-7 stores one bit from each of the respective 8-bit words being corner turned.

For purposes of illustrating writing of the data to the buffer 671 in association with a corner turn operation, the eight bits (e.g., bits "0" through "7") written to respective memories MEMORY 000 through MEMORY 111 can be referred to as "word 0" through "word 7." As such, identifier 0:1 represents bit 1 of word 0, 1:0 represents bit 0 of word 1, 7:6 represents bit 6 of word 7, 2:5 represents bit 5 of word 2, etc. As described above in association with FIGS. 3 and 4, a counter can be used to increment addresses (e.g., write addresses in association with writing data to buffer 671) provided to decode circuitry (e.g., 573) in order to write the corresponding data to the appropriate locations in buffer 671 as part of a corner turn operation. For instance, in association with writing data to buffer 671, the output of the counter can correspond to the write address bits (e.g., 569 shown in FIG. 5). Prior to writing words "0" through "7" to the respective memories 666-0 through 666-7, the counter can be reset to "000" and can be incremented through address "111," such that the eight bits of the eight respective words are written to buffer 671 as shown in FIG. 6A.

As per the Batcher corner turn example described above, and as shown in FIG. 6A, bit "n" of the respective words (e.g., word "0" to word "7") is written to a corresponding column "n" in buffer 671. For example, bit "0" of each of words "0" through word "7" is written to column 668-0 (e.g., column 000) in one of memories 666-0 to 666-7, bit "1" of each of words "0" through word "7" is written to column 668-1 (e.g., column 001) in one of memories 666-0 to 666-7, etc. The particular selected column 668-0 to 668-7 (e.g., 000 to 111) within a respective memory 666 in which the respective bits "n" are stored is determined as described above (e.g., based on the inversions of the address bits 569 on a per column select 575 basis). For instance, address modifications (e.g., binary inversions) associated with selection of a particular column 668-0 to 668-7 can be implemented using XOR gates 583 coupled to column decode multiplexors (e.g., 575) such as described above in FIG. 5.

As noted above, the particular memory 666-0 to 666-7 in which the respective bits "0" to "7" are stored can be determined based on the write address and the bit number (e.g., via bit swaps). For instance, as described above, the write addresses (e.g., 569) can be provided to a multiplexor network (e.g., 482/484), which can result in a number of bit swaps that depend on the particular bit number within a respective word.

As such, FIG. 6A illustrates the locations of words "0" through "7" in buffer memory 671 subsequent to undergoing address modifications (e.g., address inversions) consistent with a Batcher corner turn implemented via decode circuitry 573 shown in FIG. 5, and subsequent to undergoing bit swaps, which can be implemented via additional circuitry not shown in FIG. 5 (e.g., such as multiplexors 482/484 shown in FIG. 4).

Figure 6B:
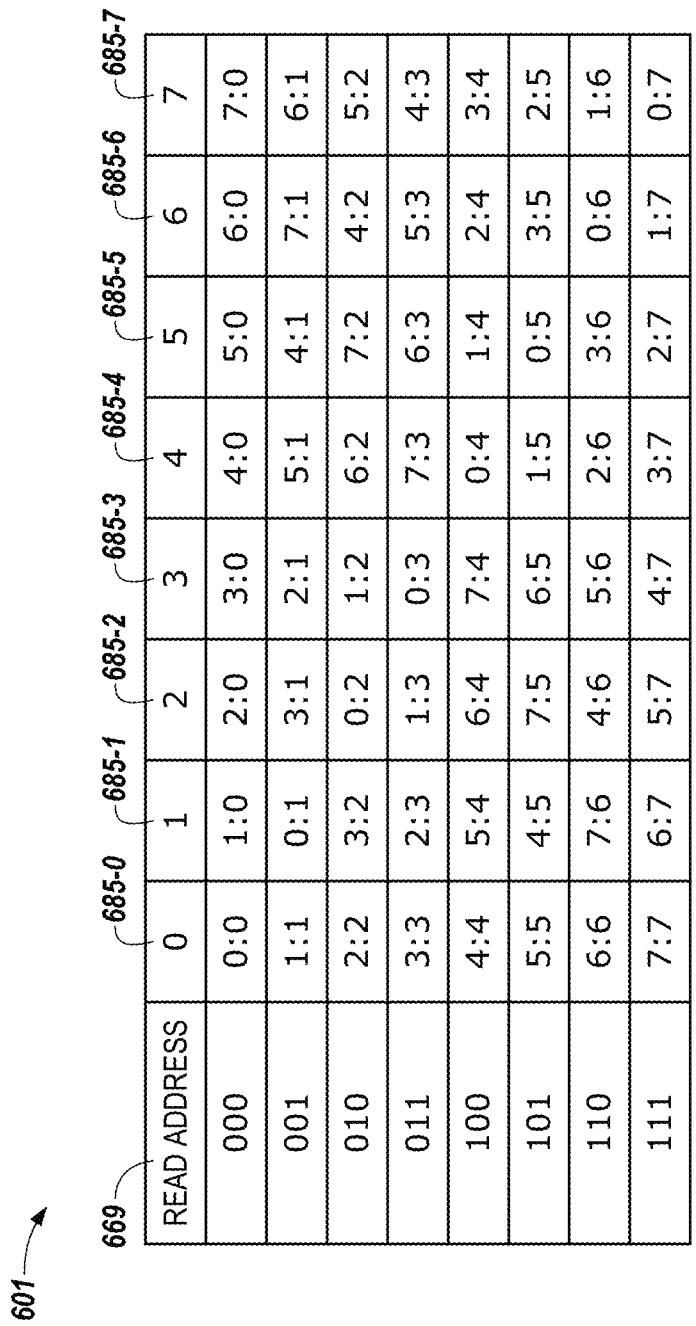
FIG. 6B is a table illustrating the number of data elements shown in FIG. 6A as read out of the array shown in FIG. 6A in association with performing a corner turn operation in accordance with a number of embodiments of the present disclosure.

FIG. 6B is a table 601 illustrating the number of data elements (e.g., word "0" through word "7") shown in FIG. 6A as read out of the array 671 in association with performing a corner turn operation in accordance with a number of embodiments of the present disclosure. Reading the data out of array 671 can include disabling the corner turn enable bits 561 shown in FIG. 5 such that the addresses (e.g., read addresses 569) are not modified via gates 583 during the read. As such, a read address 569 of "000" would result in selection of column "000" corresponding to each respective column select multiplexor 575 shown in FIG. 5, a read address of "001" would result in selection of column "001" corresponding to each respective column select multiplexor 575, etc. Recall that, as per the Batcher corner turn (e.g., as shown in FIG. 4), the addresses are modified (e.g., inverted) as data is written to the buffer or as data is read from the buffer, but need not be modified in association with both.

Table 601 indicates the constituent bits read from buffer memory 671 in association with eight successive read address 669 (e.g., 000 through 111). The read address 669 can correspond to the address bits 569 shown in FIG. 5. Table 601 also indicates which respective constituent bits of word "0" through word "7" are present on a group of data lines 685-0 to 685-7 for each of the respective successive read addresses 669. The data lines 685-0 to 685-7 correspond to the respective data lines 585-0 to 585-7 shown in FIG. 5.

As shown in table 601, reading data out of buffer 671 (with enable bits 561 being "000" such that the address inversions are disabled) in association with read address "000" yields bits 0:0, 1:0, 2:0, 3:0, 4:0, 5:0, 6:0, 7:0 on respective data lines 685-0 to 685-7, read address "001" yields bits 1:1, 0:1, 3:1, 2:1, 5:1, 4:1, 7:1, 6:1 on respective data lines 685-0 to 685-7, read address "010" yields bits 2:2, 3:2, 0:2, 1:2, 6:2, 7:2, 4:2, 5:2 on respective data lines 685-0 to 685-7, read address "011" yields bits 3:3, 2:3, 1:3, 0:3, 7:3, 6:3, 5:3, 4:3 on respective data lines 685-0 to 685-7, read address "100" yields bits 4:4, 5:4, 6:4, 7:4, 0:4, 1:4, 2:4, 3:4 on respective data lines 685-0 to 685-7, read address "101" yields bits 5:5, 4:5, 7:5, 6:5, 1:5, 0:5, 3:5, 2:5 on respective data lines 685-0 to 685-7, read address "110" yields bits 6:6, 7:6, 4:6, 5:6, 2:6, 3:6, 0:6, 1:6 on respective data lines 685-0 to 685-7, and, read address "111" yields bits 7:7, 6:7, 5:7, 4:7, 3:7, 2:7, 1:7, 0:7 on respective data lines 685-0 to 685-7. As noted above, and as shown in table 601, it is necessary to reorder the data bits on data lines 685-0 to 685-1 upon being read from memory 671 (e.g., via a number of bit swaps) in order to complete the corner turn operation on words "0" to "7." As such, reading data out of array 671 can also include performing a number of bit swaps (e.g., via multiplexor circuitry in addition to column select multiplexors such as multiplexors 575 shown in FIG. 5) such that the respective bits "0" to "7" are arranged in the appropriate order when written to the address space of a destination memory such as memory 730 shown in FIG. 7. The example shown in FIG. 7 illustrates words "0" to "7" stored in array 730 subsequent to performing bit swaps on the data as read from memory 671 as shown in table 601 in accordance with a corner turn operation.

FIG. 7 illustrates a number of data elements stored in an array 730 in association with performing a corner turn operation in accordance with a number of embodiments of the present disclosure. The example shown in FIG. 7 illustrates the eight words word "0" through word "7" subsequent to being read from the buffer memory 671 shown in FIG. 6A and then written to a different memory array 730 (e.g., an array such as array 130 shown in FIG. 1A, which can be a DRAM array, NAND array, etc.) in association with a corner turn operation. Therefore, as shown in FIG. 7, the words "0" to "7" are organized vertically in the array 730 such that the respective constituent bits "0" to "7" are organized sequentially in consecutive address locations of a same column.

In the example shown in FIG. 7, subsequent to the corner turn, the constituent bits (e.g., bit "0" to "7") of word "0" are stored in the cells coupled to column 769-0 and to access lines (e.g., rows) 774-0 to 774-7, respectively. The constituent bits of word "1" are stored in the cells coupled to column 769-1 and to access lines 774-0 to 774-7, respectively. The constituent bits of word "2" are stored in the cells coupled to column 769-2 and to access lines 774-0 to 774-7, respectively. The constituent bits of word "3" are stored in the cells coupled to column 769-3 and to access lines 774-0 to 774-7, respectively. The constituent bits of word "4" are stored in the cells coupled to column 769-4 and to access lines 774-0 to 774-7, respectively. The constituent bits of word "5" are stored in the cells coupled to column 769-5 and to access lines 774-0 to 774-7, respectively. The constituent bits of word "6" are stored in the cells coupled to column 769-6 and to access lines 774-0 to 774-7, respectively, and the constituent bits of word "7" are stored in the cells coupled to column 769-7 and to access lines 774-0 to 774-7, respectively.

The organization of the data stored in memory 730 subsequent to the corner turn is not limited to the example illustrated in FIG. 7. For example, further operations can be performed to place each of the words "0" through "7" in a same column (e.g., in association with performing a corner turn on a 64-bit word).

Furthermore, embodiments of the present disclosure are not limited to the examples described herein. For instance, a size of a corner turn buffer can be adjusted to provide for a data path greater than 64-bits. As an example, a plurality of buffer memories such as buffer memory 571 and corresponding decode circuitry 573 can be combined. Also, embodiments are not limited to a particular size of data element. For instance, the width of data elements capable of being corner turned can depend on the width of the column select multiplexors (e.g., 575), among other factors.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus comprising:
an array of memory cells; and
decode circuitry coupled to the array and including logic configured to modify an address corresponding to at least one data element in association with performing a corner turn operation on the at least one data element;
wherein the logic is configured to modify the address corresponding to the at least one data element on a per column select basis; and
wherein the corner turn operation is an operation that adjusts a storage format of the at least one data element.

2. The apparatus of claim 1, wherein the decode circuitry comprises a plurality of column select components each coupled to a respective N columns of the array, wherein "N" is at least 2.

3. The apparatus of claim 2, wherein the at least one data element comprises an M-bit wide data element, and wherein M is equal to N.

4. The apparatus of claim 2, wherein the address corresponding to the at least one data element comprises a plurality of address data units, and wherein the logic configured to modify the address corresponding to the at least one data element comprises:
first logic configured to modify a first address data unit of the plurality of address data units prior to the plurality of address data units being provided to a first of the plurality of column select components; and
second logic configured to modify a second address data unit of the plurality of address data units prior to the plurality of address data units being provided to a second of the plurality of column select components.

5. The apparatus of claim 4, wherein the logic configured to modify the address corresponding to the at least one data element further comprises:
third logic configured to modify the first address data unit and the second address data unit of the plurality of address data units prior to the plurality of address data units being provided to a third of the plurality of column select components; and
fourth logic configured to modify a third address data unit of the plurality of address data units prior to the plurality of address data units being provided to a fourth of the plurality of column select components; and
fifth logic configured to modify the first, second, and third address data units prior to the plurality of address data units being provided to a fifth of the plurality of column select components.

6. The apparatus of claim 4, wherein:
the first logic comprises a logic gate configured to receive the first address data unit and an enable data unit as inputs and invert the first address data unit responsive to a state of the enable data unit; and
the second logic comprises a logic gate configured to receive the second address data unit and an enable data unit as inputs and invert the second address data unit responsive to a state of the enable data unit.

7. The apparatus of claim 4, wherein at least one of the first logic gate and the second logic gate comprises an exclusive OR (XOR) logic gate.

8. The apparatus of claim 4, wherein the plurality of column select components each comprise a respective N:1 multiplexor.

9. The apparatus of claim 1, wherein the array and decode circuitry are located on a controller configured to:
receive the at least one data element from a host;
write the at least one data unit to the array based on the modified address corresponding thereto;
read the at least one data unit out of the array based on the modified address; and
write the at least one data element to a different array of memory cells such that the at least one data element is stored in a consecutive number of memory cells coupled to a same column of the different array.

10. An apparatus, comprising:
a corner turn buffer comprising an array of memory cells configured to store data elements, the corner turn buffer used to adjust a storage format of a data element from a first format to a second format; and
decode circuitry coupled to the array and comprising:
a plurality of N:1 column select components each corresponding to a different respective N columns of the array and configured to select a particular one of the N columns responsive to states of a plurality of address data units provided thereto and corresponding to the data element; and
address modification logic coupled to at least one of the plurality of column select components and configured to modify a state of at least one of the plurality of address data units corresponding to the data element and prior to the plurality of address data units being provided to the at least one of the plurality of column select components in association with at least one of:
writing the data element to the array; and
reading the data element from the array.

11. The apparatus of claim 10, wherein the address modification logic comprises a logic gate configured to:
receive the at least one of the plurality of address data units as a first input;
receive at least one enable data unit as a second input;
invert the at least one of the plurality of address data units; and
provide the inverted data unit as an output.

12. The apparatus of claim 11, wherein the logic gate comprises an exclusive OR (XOR) logic gate.

13. The apparatus of claim 10, wherein the address modification logic is configured to modify the state of the at least one of the plurality of address data units differently for each of the at least one of the plurality of column select components.

14. The apparatus of claim 10, wherein the data element comprises an M-bit wide data element, and the plurality of address data units comprises log 2 (M) bits, and wherein values of the plurality of address data units correspond to respective bit positions within the data element.

15. The apparatus of claim 14, wherein M is 8 and N is 8.

16. The apparatus of claim 10, further comprising a counter configured to provide the plurality of address data units at its output.

17. The apparatus of claim 10, wherein the address modification logic is configured to modify the state of the at least one of the plurality of address data units corresponding to the data element in association with only one of:
    writing the data element to the array; and
    reading the data element from the array.

18. The apparatus of claim 10, further comprising a controller, wherein the corner turn buffer and the decode circuitry are located on the controller, and wherein the controller is configured to:
    read the data element from the array; and
    write the data element to a different array to which the controller is coupled such that the data element is stored vertically in the different array.

19. The apparatus of claim 10, further comprising a channel controller, wherein the corner turn buffer and the decode circuitry are located on the channel controller, and wherein the channel controller is configured to communicate with a memory controller configured to:
    receive the data element from the corner turn buffer; and
    write the data element to a different array to which the memory controller is coupled such that the data element is stored vertically in the different array.

20. An apparatus comprising:
    a controller configured to write a data element received from a host to a first array of memory cells of a corner turn buffer in association with performing a corner turn operation on the data element, wherein the corner turn operation is an operation that adjusts a storage format of the data element;
    wherein the corner turn buffer comprises decode circuitry coupled to the first array and comprising:
        a plurality of column select components each coupled to a respective plurality of columns of the first array; and
        address modification logic coupled to at least one of the plurality of column select components and configured to modify a state of at least one of a plurality of address data units corresponding to the data element and prior to the plurality of address data units being provided to the at least one of the plurality of column select components in association with writing the data element to the first array; and
    wherein the controller is further configured to:
        read the data element out of the first array; and
        write the data element in cells coupled to a same column of and to a number of different access lines of a second array.

21. The apparatus of claim 20, wherein the second array is coupled to sensing circuitry comprising a plurality of sense amplifiers and compute components.

22. The apparatus of claim 21, wherein the plurality of sense amplifiers and compute components correspond to a respective plurality of columns of the second array and are configured to serve as a respective plurality of 1-bit processing resources.

\* \* \* \* \*